(12) United States Patent
Bhalla et al.

(10) Patent No.: US 6,437,419 B1
(45) Date of Patent: Aug. 20, 2002

(54) EMITTER BALLAST RESISTOR WITH ENHANCED BODY EFFECT TO IMPROVE THE SHORT CIRCUIT WITHSTAND CAPABILITY OF POWER DEVICES

(75) Inventors: Anup Bhalla, Santa Clara, CA (US); Praveen Muraleedharan Shenoy, Wilkes-Barre, PA (US)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 09/450,872

(22) Filed: Nov. 29, 1999

(51) Int. Cl.[7] .............................................. H01L 27/082
(52) U.S. Cl. ................... 257/582; 257/144; 257/164; 257/341; 257/348; 257/409; 257/580; 257/581; 257/582; 257/583; 257/584; 257/572; 257/577
(58) Field of Search ................... 257/580, 581, 257/582, 583, 584, 572, 577, 144, 164, 341, 358, 409

(56) References Cited

U.S. PATENT DOCUMENTS

| | | | |
|---|---|---|---|
| 3,936,863 A | * | 2/1976 | Olmstead ................... 357/51 |
| 5,206,182 A | | 4/1993 | Freeman |
| 5,296,733 A | * | 3/1994 | Kusano et al. ............... 257/586 |
| 5,298,785 A | * | 3/1994 | Ito et al. ..................... 257/538 |
| 5,374,844 A | * | 12/1994 | Moyer ......................... 257/582 |
| 5,408,124 A | * | 4/1995 | Palara ......................... 257/580 |
| 5,637,902 A | | 6/1997 | Jiang |
| 5,712,200 A | | 1/1998 | Jiang |
| 5,736,755 A | * | 4/1998 | Fruth et al. .................. 257/166 |
| 5,760,457 A | * | 6/1998 | Mitsui et al. ................ 257/582 |
| 6,043,520 A | * | 3/2000 | Yamamoto et al. ......... 257/198 |
| 6,081,003 A | * | 6/2000 | Miyakuni et al. ........... 257/197 |

OTHER PUBLICATIONS

B. Jayant Baliga, "Power MOS—BIPOLAR Devices", *Krieger Publishing Company*, Malabar, Florida, pp 344–380.

* cited by examiner

Primary Examiner—Eddie Lee
Assistant Examiner—Edgardo Ortiz
(74) Attorney, Agent, or Firm—Jaeckle Flieschmann & Mugel, LLP (57) ABSTRACT

A power semiconductor device has an integral source/emitter ballast resistor. The gate has partial gate structures spaced apart from each other. Emitter resistors are provided beneath sidewall spacers on the ends of the gate structures. The emitter resistors have little effect on the threshold voltage under normal operating conditions, but rapidly saturate the device during short circuit conditions. This in turn increases the short circuit withstand capability o the device.

14 Claims, 10 Drawing Sheets

EMITTER BALLAST RESISTOR WITH ENHANCED BODY EFFECT TO IMPROVE THE SHORT CIRCUIT WITHSTAND CAPABILITY OF POWER DEVICES

BACKGROUND OF THE INVENTION

Using emitter ballasting resistors in insulated gate bipolar transistors (IGBTs) improves immunity to latch-up and improves short circuit ruggedness. Others have thought that the improvement is due to an increase in the voltage drop in the P-region beneath the N+source needed to activate a parasitic thyristor, and to de-biasing of the gate by the voltage drop in the ballast resistor. However, we have discovered a novel way for manufacturing devices where the ballast resistor is combined with the body effect of the device so that the voltage drop has negligible effect at operating current and adjusts the threshold voltage such that it increases by several volts under short circuit current conditions.

BRIEF SUMMARY OF THE INVENTION

In a semiconductor device such as an IGBT or other power devices such as DMOS, MOSFETs, and MCTs, the emitter is provided with an emitter ballast resistor and the body effect is modified by controlling the value of the emitter ballast resistor. The invention provides a method for more precisely controlling the size and resistance of ballast resistors without the use of a masking layer. The invention provides a source/emitter ballast resistor that is self-aligned with a sidewall spacer of the cellular gate structures.

The invention provides a semiconductor device with an integral source/emitter ballast resistor. The device is fabricated in a semiconductor substrate, typically an N-type substrate. The substrate has an elongated P-well region where the edges of the P-well form PN junctions with the N-type substrate at the surface. A single gate has a plurality of partial gate structures that are spaced apart from each other on the surface of the substrate. Each gate structure has a gate oxide or a gate insulator layer on the substrate surface with a conductive gate on top of the gate insulator. Two opposing gate structures cover opposite elongated ends of a P-well region. On the edges of the gate structures facing each other, each gate structure has a sidewall spacer insulator. Beneath the sidewall spacer insulator is a self-aligned, lightly doped N-type region that forms the emitter/source ballast resistor. Extending transverse to the opposing elongated emitter ballast resistors are one or more heavily doped N-type contact regions. The remaining surface of the substrate is doped with a P+ type dopant in order to eliminate the effect of the lightly doped N-type region, except for the region beneath the sidewall spacer insulators.

We found that under normal operation the threshold voltage of devices made with the invention increase by negligible amount, i.e., a few millivolts. However, when the device enters a short circuit operation, the emitter ballast resistors have a dramatic effect upon limiting the short circuit current. During short circuit operation, the body effect due to the emitter ballast resistor produces a threshold voltage that is anywhere from 2–4 volts greater than the normal threshold voltage. As such, a device under short circuit conditions will saturate sooner and therefore will be protected against carrying excess current.

The inventive process also includes a method for fabricating the novel structure. With this method, the elongated P-well is formed in the surface of the semiconductor with an N-type doping. The gate structure is formed on the surface of the semiconductor substrate. Then the P-well dopant is implanted into the surface of the substrate without need for a further mask. Next, again using the gate structure as a mask, an N-type dopant is implanted into the surface of the semiconductor. The N-type dopant is then diffused down into the semiconductor but remains substantially aligned with the edges of the gate structure. Next, the gate is modified to add a sidewall spacer. Sidewall spacing is a conventional step in gate fabrication. Next, the substrate is masked to establish N+ contact regions. This mask is a non-critical mask since the N-type contact regions will self-align with the emitter ballast resistors. Thereafter, the mask is stripped and the surface is again implanted with a P-type dopant in order to eliminate the effect of the lightly doped N-region. As such, the surface of the semiconductor provides alternate regions of P+ and N+. The N+ regions extend across the face of the semiconductor from one sidewall to the next. The edges of the N+ regions are connected to the emitter ballast resistors that extend along the length of the P-well beneath the sidewall spacers.

BRIEF DESCRIPTION OF THE DRAWINGS

FIG. 1b is a planar view of the structure shown in FIG. 1a.

DETAILED DESCRIPTION OF THE DRAWINGS

Figure 1A:
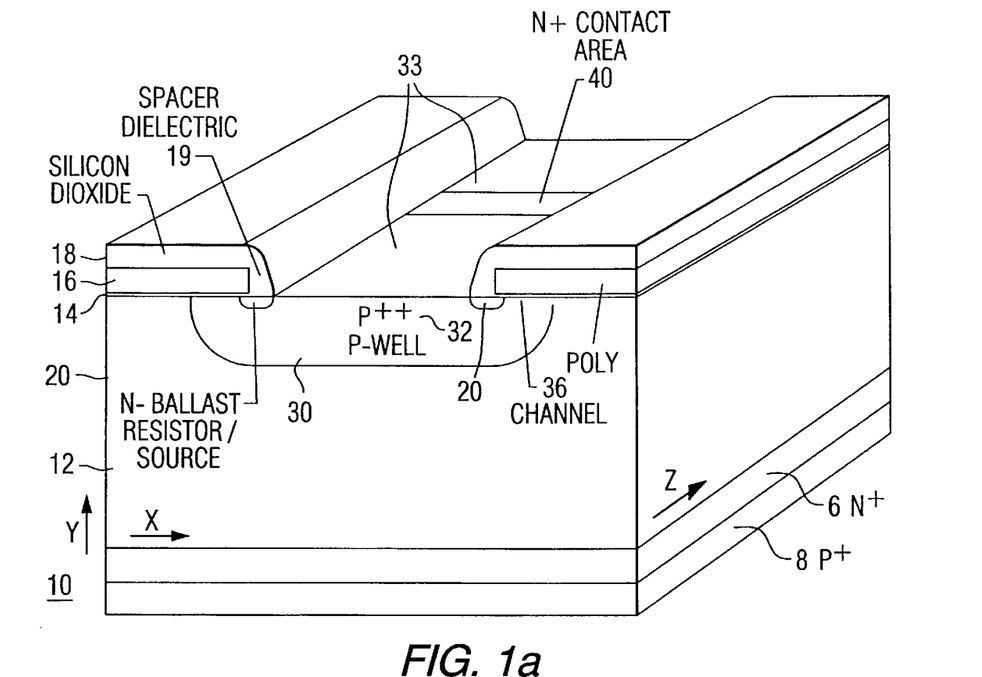
FIG. 1 is a partial perspective of a semiconductor substrate with self-aligned ballast emitter source resistors.
Figure 1B:
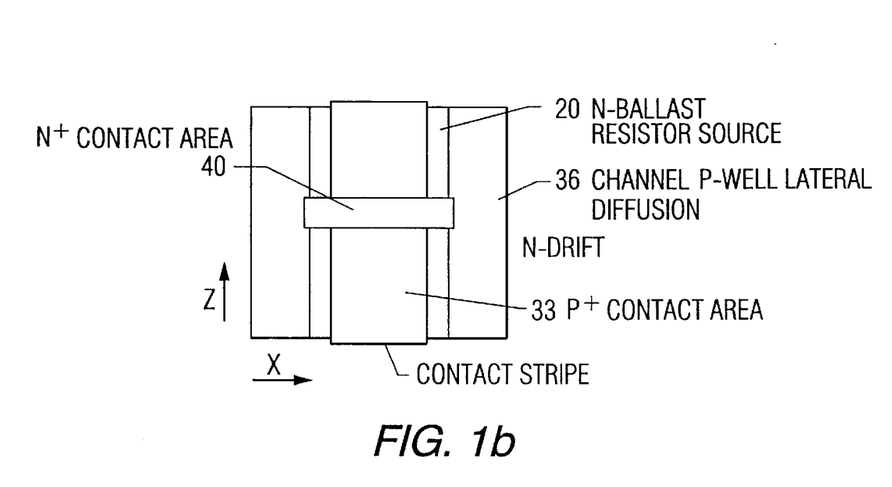

Turning to FIGS. 1a, 1b, there are shown partial sections of a device including the invention. The following description will be given for an IGBT. However, those skilled in the art will appreciate that the ballast resistor may be formed in other devices, including and not limited to DMOS, MOSFET, and MCT devices. Those skilled in the art understand that the gate is a single gate comprising a striped or cellular gate structures.

FIG. 10 shows a typical IGBT device that includes the inventive source/emitter ballast resistor 20. The device includes an N-type substrate 12 with a highly P-doped anode layer 8 on the bottom covered by a highly n-doped drain layer 6. P-well 30 is in the bulk of the wafer near the top surface thereof The surface of the P-well 30 has a highly doped P-type layer 32. The P-well 30 extends along the length of the device in the direction, i.e., into the paper. The z direction is better shown in FIG. 1b. On the top surface of the substrate 12 portions of the gate are opposite each other. The gate portions include a gate oxide layer 14 on the surface of the substrate. The gate 16 includes a number of parallel gate fingers 16a, 16b . . . 16n. The fingers ate conventionally connect to each other to form a single gate. In the striped gate version the gate portions are elongated fingers; in the cellular version the gate portions are on the opposite boundaries of the cell. On top of the gate oxide layer 14 there is a layer of doped polysilicon 16. Covering the doped polysilicon 16 is a silicon dioxide layer 18 that includes sidewall spacers 19. Sidewall spacers 19 also run the z length of the P-wells 30. Beneath the sidewall spacers 19 are elongated ballast resistors 20. These resistors are tied together by N+ contact areas 40 that extend from one ballast resistor across the surface of the semiconductor to the other ballast resistor. Thus, the emitter region of the device includes a plurality of N+ contact regions that extend generally in the x direction across the surface of the substrate 12. The ballast resistors extend in the z direction on opposite sides of the P-well structure 30.

Turning to FIG. 2, there are shown a series of steps for fabricating the structure shown in FIG. 1. The following description and the drawings omit the drain layer 6 and the anode layer 8. However, those skilled in the art will appreciate that those layers are part of a typical IGBT and MCT. Likewise, a MOSFET or a DMOS device would include only the additional heavily doped N-layer 6. The substrate 12 is covered with a gate oxide 14. The oxide may be deposited or thermally grown, and preferably is thermally grown. A layer of polysilicon is then deposited on the gate oxide followed by deposition of another oxide layer 18 for protecting the polysilicon layer 16. Thereupon the substrate is patterned to define the gate type structures. The gate oxide, polysilicon 16 and oxide 18 are removed from regions that define an underlying P-well.

Figure 2A:
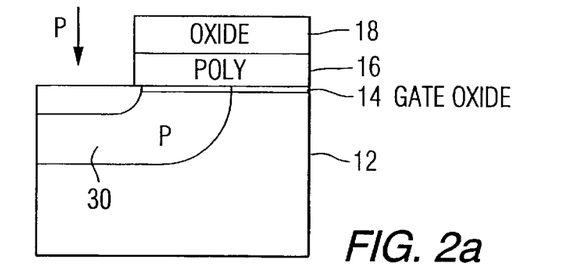
FIG. 2 is a series of process steps showing formation of the structure of FIG. 1.
Figure 2B:
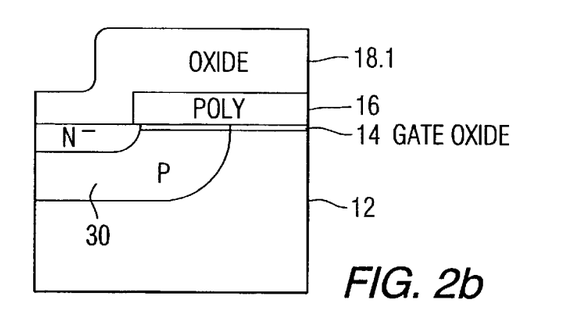
Figure 2C:
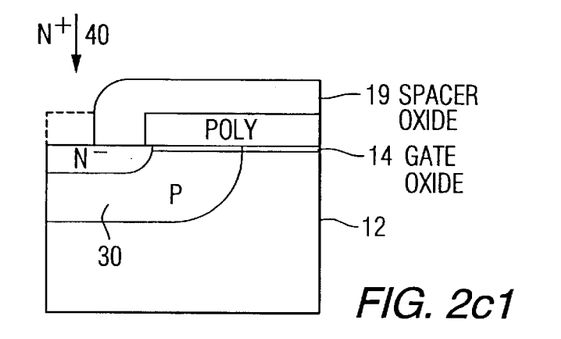
Figure 2C:
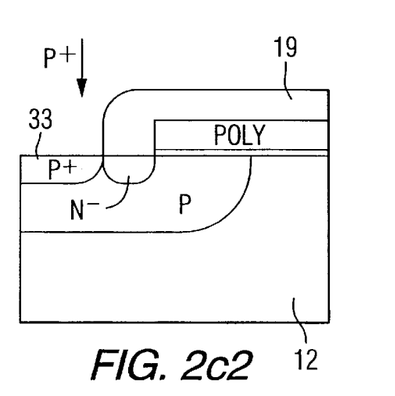

Next, a P-well implant is made with a suitable dopant, such as boron. Boron is a rapidly-diffusing dopant and quickly diffuses to form the P-well 30 that extends beneath the gate structure. Without the need for a further mask but for the gate structure, a light dose of an N-type dopant 20 is implanted into the surface of substrate 12. Implant 20 is a slower diffusing dopant such as arsenic or antimony. When it diffuses, its edge remains substantially aligned with the edge of the gate structure. Turning to FIG. 2b, an oxide layer is deposited over the substrate. The deposited layer merges with the original oxide layer 18 to form a thick oxide 18.1 over the polysilicon 16. The thick oxide layer 18.1 is then vertically etched (an isotropically etched) to expose a portion of the surface of the substrate and to provide a spacer oxide 19 covering the polysilicon 16.

Figure 2D:
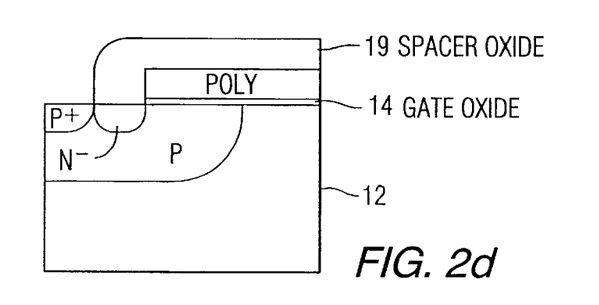
Figure 3A:
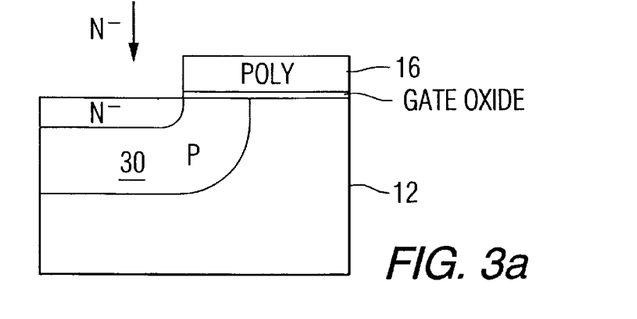
FIG. 3 is an alternate set of fabrication steps creating the structure shown in FIG. 1.
Figure 3B:
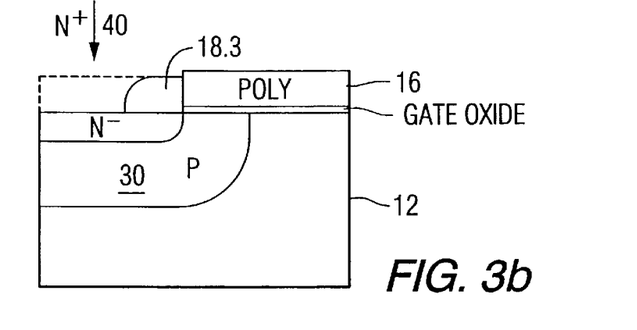
Figure 3C:
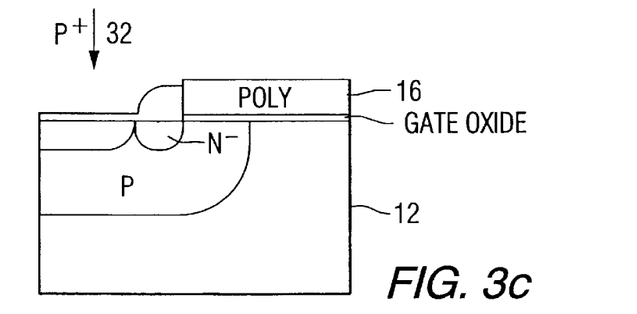
Figure 3D:
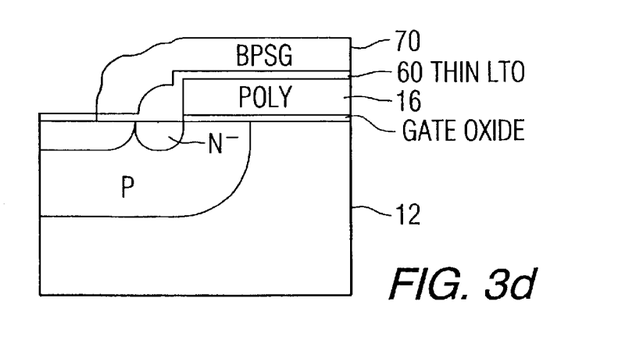

Next, a layer of photoresist 42 is deposited over the surface of the substrate 12 and is patterned to expose the N+ contact region as shown in FIG. 1b. An N-type implant 40 with a heavy concentration is implanted into the surface of the substrate in order to form the N+ contact area 40. The photoresist is then stripped and a heavily-doped P-type implant is made into the surface to form the P+ regions 33. The P-type implant counteracts the lightly-doped N-type region 20 in all areas except beneath the sidewall spacer 19. The P+ implant has no effect upon the N+ contact areas 40. The final result is shown in FIG. 2d which corresponds to the right hand portion of FIG. 1a.

An alternate approach and method allows fabrication without applying a top level oxide layer 18. This approach is shown in FIG. 3. There, polysilicon layer 16 is deposited with an oxide and then is etched vertically to leave the remaining oxide spacer 18.3. Following that step, substrate 12 is patterned with photoresist 42 to expose contact regions for an N-type implant to form the N+ contact regions 40. The photoresist 42 is stripped and a thin low-temperature oxide layer 60 is grown over the entire surface. Next, the P+ implant 32 is made into the surface of the substrate 12. A thin oxide layer 60 is grown and etched in a conventional fashion to provide a mask that covers the contact area A BPSG layer is put down and etched in a conventional fashion using a mask that requires alignment to the polysilicon 16. The thin undoped oxide layer 60 prevents counter-doping of the contacts by the phosphorous in the BPSG layer 70. The thin undoped oxide 60 may also be deposited before the contact step to reduce damage from the P-type implant 32.

As a result of the foregoing processes, those skilled in the art are able to form emitter/source ballast resistors that are in series and effectively part of the emitter or source contact. The resistors are formed with a geometry that would generally be impossible to achieve using traditional photomasking operations. The cross-section of the resistor is defined by the width of the gate sidewall spacer. The resulting resistor only alters the normal operating conditions of the device by changing the threshold voltage a few millivolts. However, when the device enters the short circuit condition, the resistor has an impact on the body effect of the device. When that occurs, increased current flowing through the ballast resistors causes a voltage drop of 0.2–0.4 v which in turn increases the Vt1 by 2–4 volts due to the enhanced body effect. As a result, channel conductance goes down and therefore the current is reduced. When the current is reduced, saturation occurs at a much lower current, thereby allowing the device to withstand a short circuit for a longer time.

In contrast to prior art devices, the invention has little or no effect on devices during normal operation, but has a dramatic effect upon the device when the device enters a dangerous, short circuit condition.

The advantages of this technique for realizing an emitter ballast resistance are The light doping of the source region allows a much higher value of resistance over a given length of the cell in the z direction to be realized that would be possible with prior art N+ sources.

Since the width of the resistor is set by the spacer, a much smaller width, and therefore, a much higher resistance may be realized than with lithographically defined resistors. The spacer width may be accurately controlled by control of the deposited thickness of the spacer material, the RIE spacer etch and the sidewall angle of the Polysilicon.

Controlling the length of the resistor in the z-direction limits the non-uniformity of current flow during short-circuit.

A high threshold and high body effect parameter is used in conjunction with this ballast resistance to maximize the reduction in peak current flow through the IGBT during short-circuit fault conditions. It will be shown how a 50–100 mV drop in the ballast resistor at operating currents (100 A/cm$^2$) are sufficient to produce a 2–4V change in effective threshold voltage under high current conditions with proper body effect engineering. This allows the production of devices with over 10 $\mu$s short circuit withstand time (SCWT) with virtually no degradation in conduction-drop, The fact that the effective threshold voltage now increases with device current means that this robustness can now be achieved without resorting to a high low current threshold voltage, which causes higher conduction and turn-on losses when the gate drive voltage is 15V.

Discussion of the Body Effect and Engineering the Cell for Maximum Performance.

This last factor listed in the above set of attributes is extremely important to the ability of the IGBT to control short-circuit overcurrents. The peak current flow in the IGBT during short-circuit conditions is approximated by the formula $$I_{PK} = \frac{1}{(1-\alpha_{PNP})} \frac{\mu_n C_{ox} W_{ch}}{L_{ch}} \times \frac{[V_{gs} - V_{th} - (1\alpha_{PNP})I_{PK} \cdot R_{ball}]}{} \quad (1)$$

where $\alpha_{PNP}$ is the gain of the IGBT, $V_{gs}$, is the applied gate-source voltage, $V_{th}$ is the threshold voltage, $\mu_n$, is the effective channel mobility, $C_{OX}$, is the oxide capacitance per unit area given by $\epsilon_{OX}/t_{OX}$, $W_{chi}$ is the channel width, $L_{ch}$ is the channel length, and $R_{ball}$ is the magnitude of the ballast resistance. In the past, the effect of a ballast resistance on reduction of short circuit current was thought to stem predominantly from the de-biasing of the gate ($V_{gs}$–$V_{th}$,) by the amount of the drop in the ballast resistance $(1-\alpha_{PNP})I_C R_{ball}$. The underlying assumption here was that little change occurred in the effective $V_{th}$ of the device in the presence of this ballast resistance.

The threshold voltage depends on this drop across the ballast resistance by the formula $$V_{th} = V_{th0} + Y(\sqrt{2\phi_P - V_{sb}} - \sqrt{2\phi_P}) \quad (2)$$

where $V_{th0}$ and the body effect parameter Y are given by $$V_{th} = V_{FB} + 2\phi_P + \sqrt{\frac{2\varepsilon_s q N_A}{C_{ox}}} \quad (3)$$

$$Y = \sqrt{\frac{2\varepsilon_s q N_A}{C_{ox}}} \quad (4)$$

$$\phi_P = kT \ln\left[\frac{N_A}{n_i}\right] \quad (5)$$

$$V_{sb} = (1-\alpha_{PNP})I_C R_{ball} \quad (6)$$

where $V_{FB}$ is the flatband voltage, $2_{\psi P}$ is the surface potential, and $N_A$ is the channel doping.

The source-body junction is reverse biased by the drop $V_{sb}$ in the ballast resistance as given by equation (6). If the body effect parameter is small, the change in $V_{th}$, is small, and the reduction in peak short-circuit current comes largely from de-biasing the gate by the drop in the ballast resistance—as previously thought. If, however, the body effect parameter is sufficiently large, even a small drop $V_{sb}$ can result in a significant increase in $V_{th}$, leading to a dramatic reduction in peak short-circuit current.

Sample Calculations

In the following calculations $V_{FB}=0V$ is assumed. Assuming a uniformly doped channel with a doping of $2.5 \times 10^{16}$ cm$^{-3}$, with $t_{OX}=300$ Å, we obtain $V_{th0}=1.43V$ and $\{y\}=0.8V$. If the drop in the ballast resistance reaches $V_{sb}=0.1V$, then the threshold voltage increases to $V_{th}=1.68V$, and for $V_{sb}=0.5V$, the threshold voltage increases to $V_{th}=2.0V$. The increase in $V_{th}$ is only 0.57V for $V_{sb}=0.5V$. However, for the typical case of an IGBT with $t_{OX}=1000$ Å, with a doping of $1 \times 10^{17}$ cm$^{-3}$, and $\{y\}=5.32$, and the threshold voltage $V_{th0}=5.6V$ which increases to $V_{th}=7.3V$ for $V_{sb}=0.1V$ and $V_{th_{sb}}=9.4V$ for $V_{sb}=0.5V$. Here we get a Vth increase of 3.8V for $V_{sb}=0.5V$!

Figure 4:
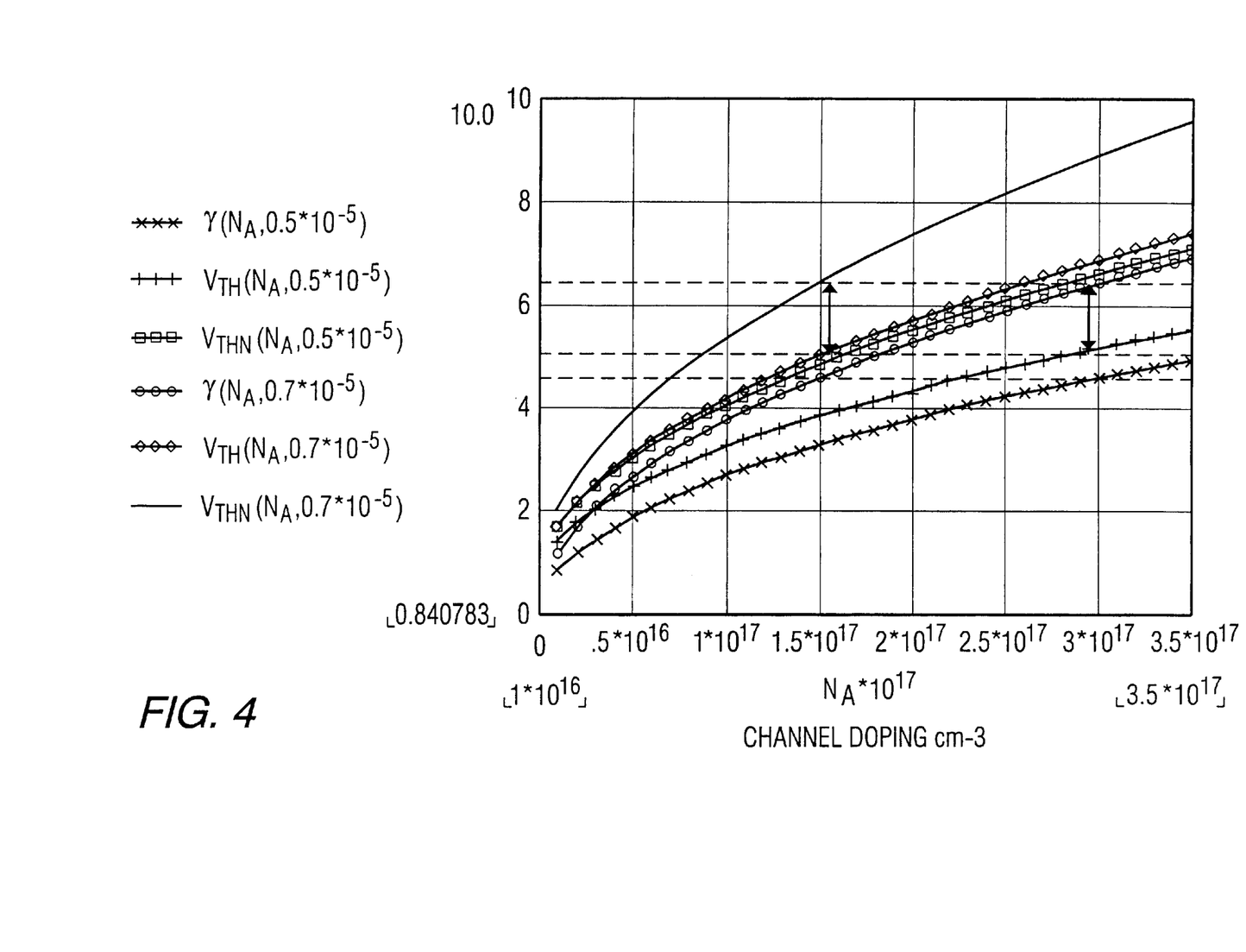
FIG. 4 is a set of graphs showing selected parameters as a function of channel doping.

Clearly, a large body effect induced change in $V_{th}$ may be obtained under overcurrent conditions if the body effect parameter is made large, and a drop of 0.5V or so is obtained across the ballast resistance. As shown in FIG. 4, in the body effect parameter increases with the $V_{th}$ voltage, since it is controlled by the same factors. For uniformly doped channels, the increase in $V_{th}$ for a given bias $V_{sb}$ is almost independent of oxide thickness for devices with the same initial $V_{th0}$.

Body Effect Simulations in DMOS IGBTs

Figure 5:
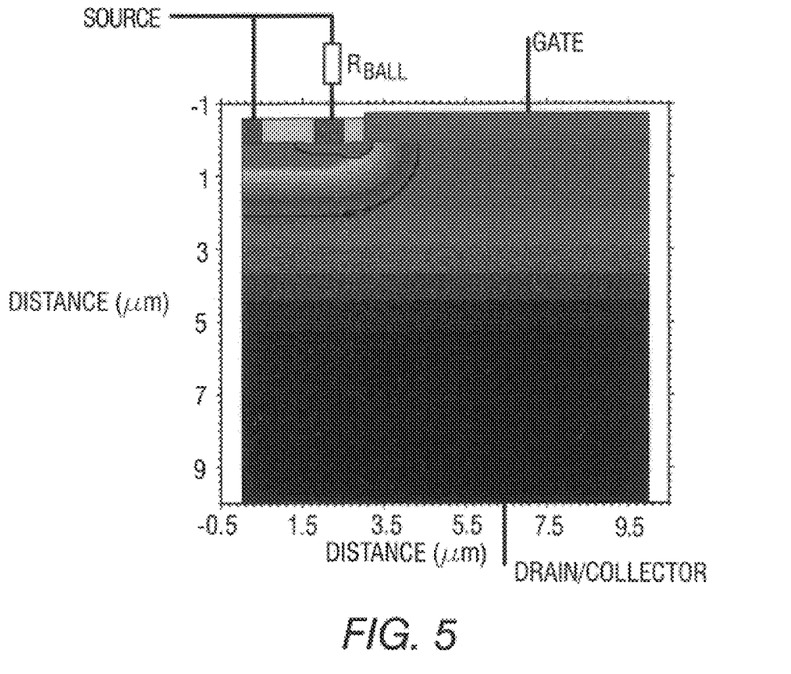
FIG. 5 is a sketch of cell used to simulate the emitter ballast resistor.
Figure 6:
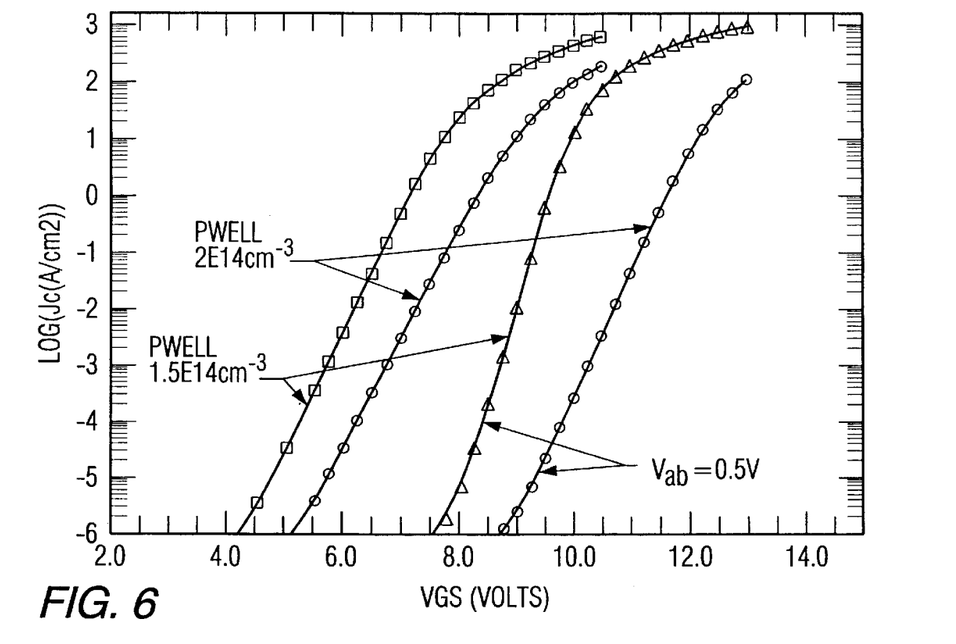
FIG. 6 shows comparative shifts in Vth.
Figure 7:
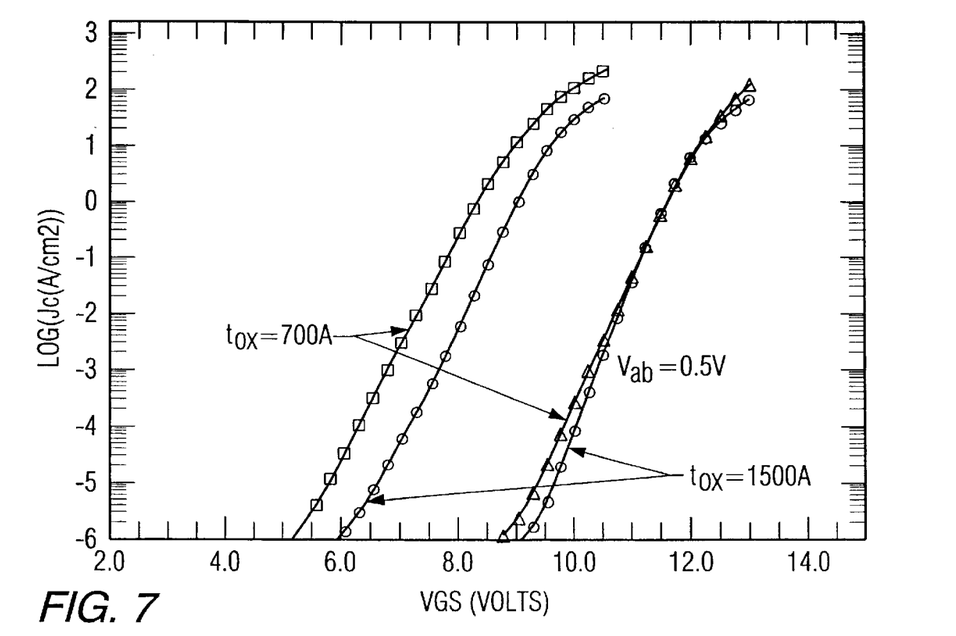
FIG. 7 shows comparative shifts as a function of Vgs.
Figure 8:
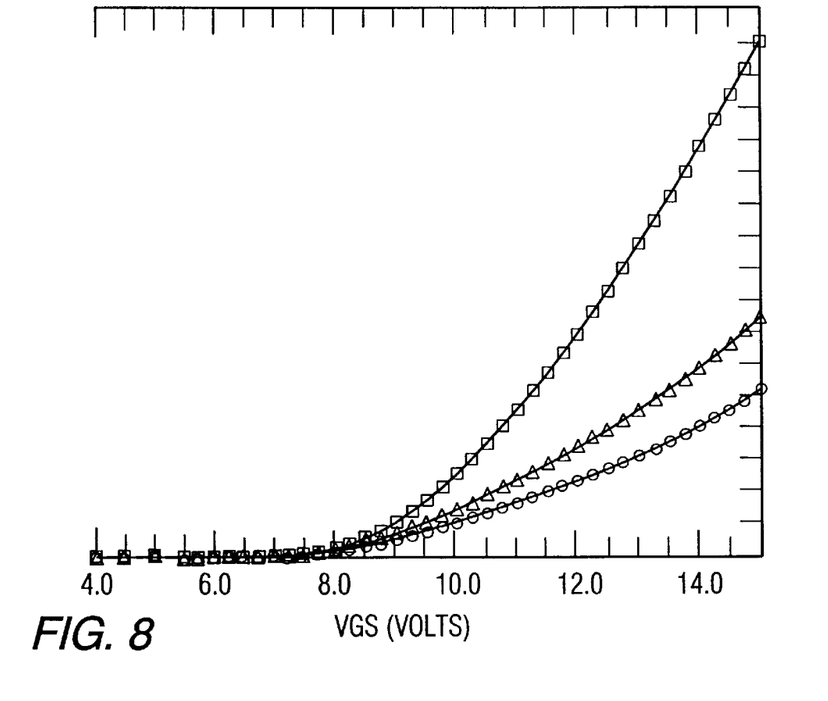
FIG. 8 shows comparative values for peak current for different emitter ballast resistances.

The body effect in emitter ballasted IGBTs is examined in more detail by numerically simulating the structure. The source electrode is split into a separate source (contacts N+only) and body electrode (contacts P+ only) as shown in FIG. 5. If a constant bias of $V_{sb}=0.5V$ is applied between the source and body, the change in $V_{th}$ obtained by simulation is plotted in FIG. 6. It is clear that a threshold shift of 3–4 volts results from a 0.5V bias in such a DMOS structure. FIG. 7 shows that for a given value of $V_{th0}$, the body effect is greater for a 700 Å thick gate oxide vs. a 1500 Å thick oxide. The change in peak current through the IGBT as a function of the ballast resistance at $V_{GE}=V_{CE}=15V$ is shown in FIG. 8. A factor of two reduction is easily achieved with a $10^4$ ohm/$\mu$m resistance, which degrades the on-state drop by less that 100 mV (FIG. 9) (This translates to a—sheet resistance of 500–1000 $\Omega$/sq. for the narrow resistor formed by the spacer in this process). It is also seen that doubling this resistance does not halve the peak current, even though it doubles the degradation in the on-state voltage drop. Finally, the effect of this ballast resistance and body effect on the actual SCWT waveform is shown in FIG. 10. The increase in SCWT with this ballast resistance is clear, and the effect of placing the same ballast resistance in series with both the source and body is clearly much smaller. This proves conclusively that the large improvement in SCWT stems from the body effect rather than the direct de-biasing of the gate.

Experimental Results

Figure 11A:
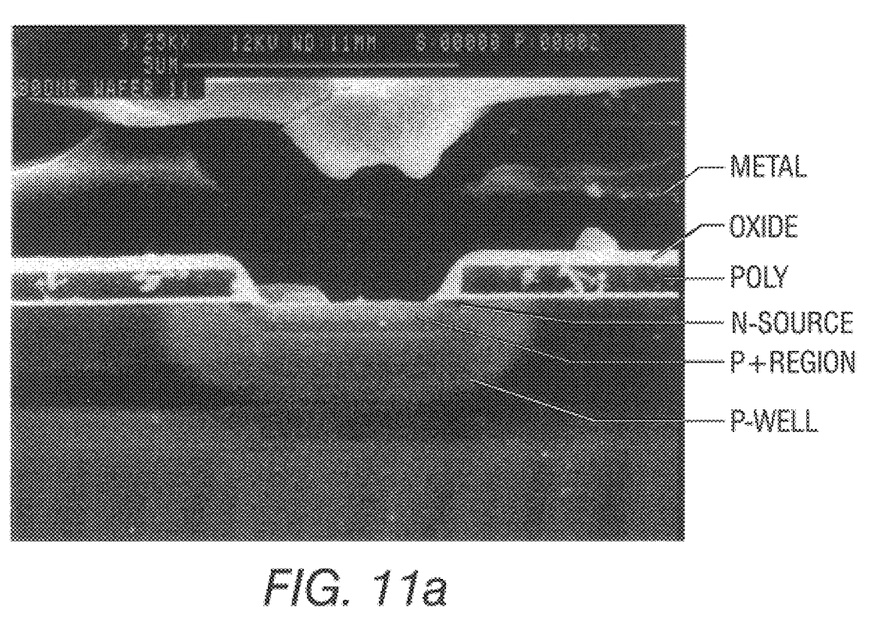
FIGS. 11a and 11b are scanning electron photomicrographs of cross sections of finished devices having emitter ballast resistances.
Figure 11B:
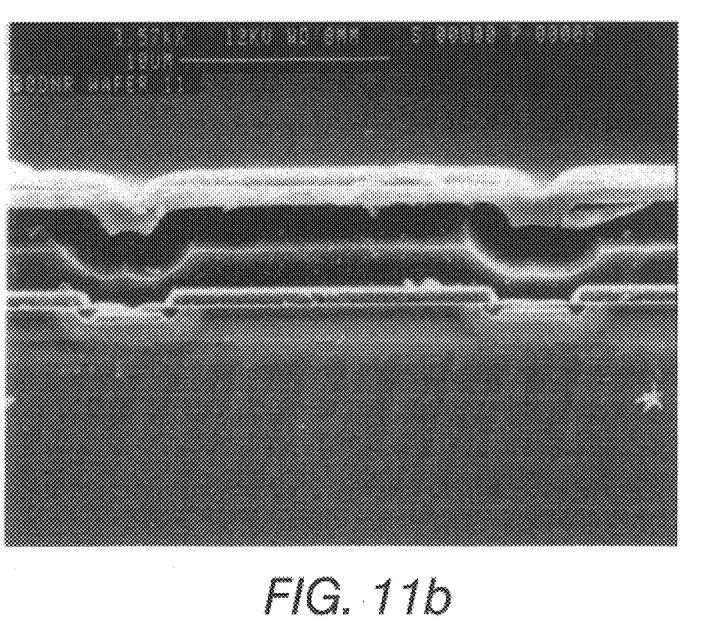

FIG. 11 shows a scanning electron microscope picture of a finished device using the process of FIG. 2. The device had an active area of 0.4 cm$^2$, a blocking voltage rating of 600V, and was formed as a stripe with a 4 $\mu$m Poly opening and 16 $\mu$m Poly web. The small contact pattern was formed in a self-aligned fashion, allowing the use of projection aligners and a 4 $\mu$m minimum photo design rule. This allows the designer to maximize the injection enhancement effect [3] without the need for steppers and tight photo tolerances. The N+pattern consisted of 4$\mu$m stripes running perpendicular to the Poly at 16 $\mu$m intervals.

These devices show a low on-state voltage drop of 1.5–1.6V and very fast turn-off (low $E_{OFF}$, Table below), indicating that the drop in the ballast resistances at rated current is small. The peak short-circuit currents were between 700–800 A/cm$^2$, resulting in SCWT values of 16–20 $\mu$s, at 360V, 125C. It is clear that in case B, the higher starting $V_{th}$ results in a greater drop in peak current as expected from a greater $V_{th}$ and greater body effect. The impact of the higher $V_{th}$, on the turn-on dI/dt is also clear. Note that these values of turn-on dI/dt are easily fast enough—beyond this turn-on dI/dt the diode recovery presents problems.

| Parameter | Self-Aligned device A | Self-Aligned device B |
|---|---|---|
| $V_{CESAT}$(27 C) | 1.6 V | 1.53 V |
| $V_{CESAT}$(150 C) | 1.57 V | 1.495 V |
| $E_{OFF}$ (150 C, 40 A, 480 V) | 1.485 mJ | 1.75 mJ |
| Latching | CL 210 A | CL 160 A |
| $V_{TH}$ | 6.52 V | 7.33 V |
| Turn-on dI/dt | 960 A/µs | 800 A/µs |
| Turn-on dV/st | 18.2 V/ns | 17 V/ns |
| $E_{ON}$(150 C, 40 A, 480 V) | 1.71 mJ | 1.97 mJ |
| SCWT $I_{PK}$ (A) | 320 A | 280 A |
| SCWT (360 V, 125 C, $R_g$ = 3 Ω) | 16 µs | 17 µs |

Key Design Factors to Improve the Ruggedness of IOBTs in Short-circuit

Based on the above analysis, the following design ideas are suggested

Figure 12:
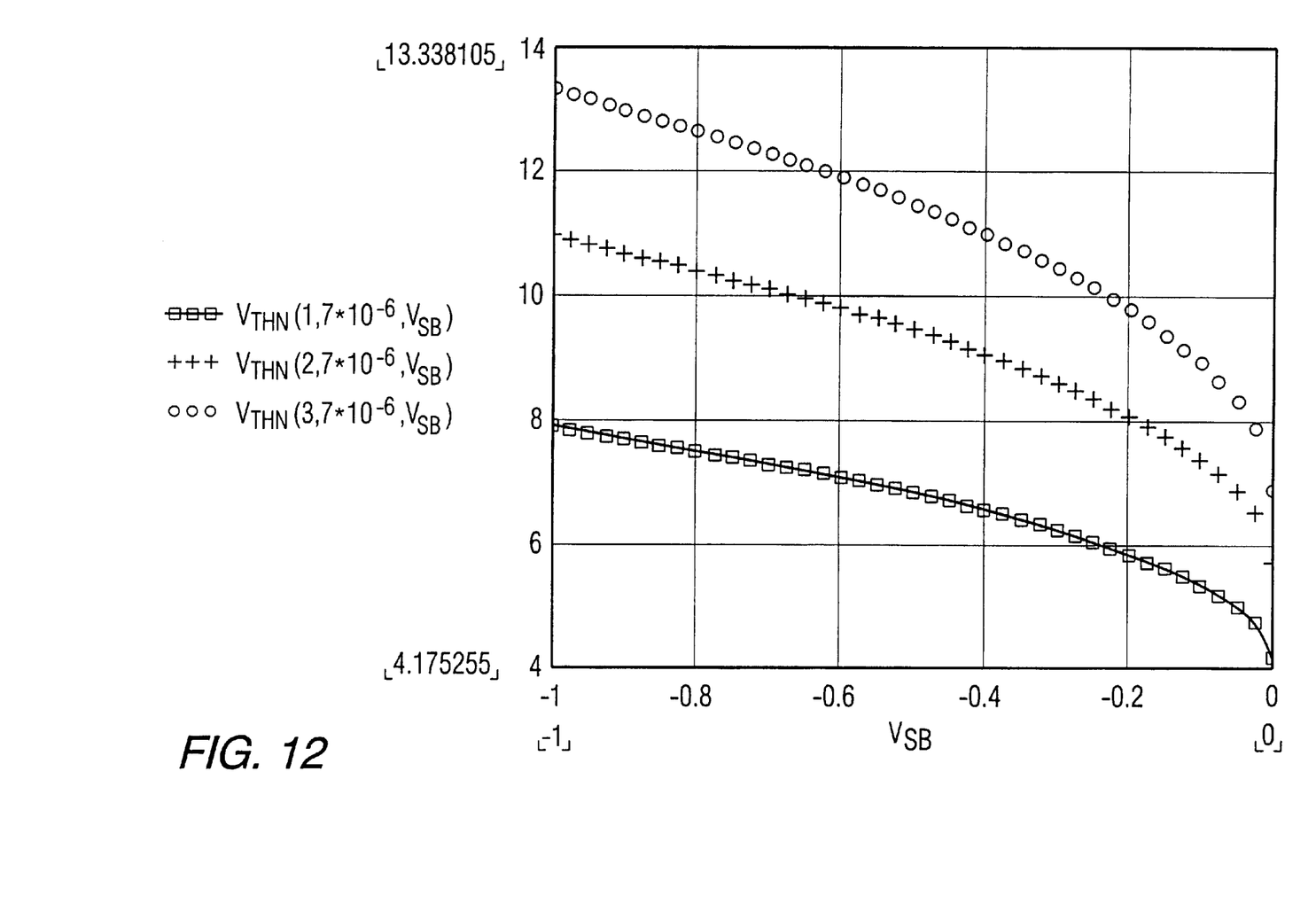
FIG. 12 shows comparative graphs of changes in threshold voltage for different emitter ballast resistances.

The change in threshold voltage versus the drop in the ballast resistor $V_{sb}$ is shown in FIG. 12. It becomes clear that the change in $V_{th}$ is not linear with $V_{sb}$ (eqtn. 2), and that the percent decrease in peak short circuit current will be greater for the first 0.5V drop in the ballast resistance than for the next 0.5V. Therefore, designing for a drop of greater than 0.5V at peak short-circuit currents is not optimal.

For a given low current threshold voltage $V_{th0}$, the increase in $V_{th}$ with $V_{sb}$ is greater for higher initial values of $V_{th0}$. This is because with higher channel dopings, the body effect parameter is greater. However, as the value of $V_{th}$ is increased, the turn-on speed of the IGBT can be slowed to an undesirable extent especially when the gate drive voltage drops from 15V to 12V. In order to prevent excessive turn-on losses in the IGBT, a value of $V_{th0}$ in the range of 5V to 7V is practical.

As shown through numerical simulations, the body effect in power devices with non-uniformly doped channels is somewhat different than for devices with uniformly doped channels. In particular, the effect of oxide thickness on the body effect parameter is greater. A given drop in the ballast resistor $V_{sb}$ produces a greater $V_{th}$, shift for a thinner gate oxide. However, the peak current through the device increases inversely with oxide thickness as shown in equation (1). These two competing effects must be considered in design. In a design where these effects cancel each other, for the same $V_{CE(SAT)}$–$E_{OFF}$ performance, the device with the thicker gate oxide has a lower input and gate-drain capacitance. This benefit is countered by the lower P-well doping, that leads to a higher -resistance under the source region, and makes the device more prone to latch-up. It also lowers the peak lattice temperature at which the threshold voltage goes to zero, leading to loss of gate control and device destruction. Since the device is very robust against latch-up, the oxide thickness can be effectively increased from 500–700 A to 1000–1500 A without a excessive compromise in SCWT, latch-up and UIS capability.

In order to obtain a lower $V_{th}$ along with a high body effect parameter, it is necessary to reduce the $V_{th}$ without lowering the doping in the channel. This may be achieved only by changing the flatband voltage, which in turn requires that the gate-semiconductor workfunction difference be altered. In particular, the use of a gate material with a lower workfunction (e.g. Magnesium, Cesium) will allow a low $V_{th}$ n-channel device with a high body effect parameter.

A further technique for maximizing the effect of the ballast resistor and increasing the $V_{th}$ at high currents would be to form a non-linear ballast resistance. If the ballast resistance value increases as the current through it increases, the effect is to minimize the degradation in $V_{CE(SAT)}$ at rated current, but to still get a large drop $V_{sb}$ under overcurrent conditions, providing good short-circuit robustness. This requires the formation of a lightly doped—resistor in the P-well, which gets increasingly depleted as the drop $V_{sb}$ increases. A lightly doped resistance must be formed in this process by counter-doping the P-well region. In order to control this resistance accurately, this is more easily done if the P-well doping is low to begin with, and if the—implanted layer is diffused to form a flatter doping profile. This tends to favor the use of light P-well doping and thicker gate oxides, within the constraints of latch-up immunity.

What is claimed is:

1. A semiconductor device with an integral source/emitter ballast resistor comprising:

a semiconductor substrate;

A P-well region in the substrate having a P-type polarity;

a single gate with a plurality of partial first and second gate structures spaced apart from each other on the surface of the substrate, each partial gate structure having a gate sidewall spacer insulator along the opposite edges of the gate structures and said partial gate structures extending along opposite lengths of the P-well and covering opposite portions of said P-well;

a source or emitter region in the P-well region and having a pair of resistor regions of lightly doped N-type dopants, each resistor region extending along the length of the P-well and beneath the gate sidewall spacer insulator; and highly doped N-type contact regions in the substrate extending in a direction transverse to the edges of the partial gate structures for providing ohmic metal contact to the resistor regions.

2. The semiconductor device of claim 1 wherein regions of the substrate between the gate sidewall spacer insulators and between heavily doped N-type regions is heavily doped with P-type dopants.

3. The semiconductor device of claim 2 wherein N-type dopants are substituted for P-type dopants and vice versa.

4. The semiconductor device of claim 1 comprising one of group consisting of MOSFET, IGBT, MCT and DMOS devices.

5. The semiconductor device of claim 1 wherein the partial gate structures are either stripes or cells.

6. The semiconductor device of claim 1 wherein the resistors alter the normal threshold voltage by a few millivolts and alter the short circuit threshold voltage by more than 10%.

7. A semiconductor device with an integral source/emitter ballast resistor comprising:

a semiconductor substrate;

a P-well region in the substrate having a P-type polarity;

a single gate with a plurality of partial first and second gate structures spaced apart from each other on the surface of the substrate, each partial gate structure having a gate sidewall spacer insulator along the opposite edges of the gate structures and said partial gate structures extending along opposite lengths of the P-well and covering opposite portions of said P-well;

a highly doped N-type source or emitter region in the substrate and extending transverse to the gate structures;

means in the substrate aligned with the partial gate structures and connected to the source/emitter regions for generating a first threshold voltage during normal operation of the device and for generating a second threshold voltage during a short circuit operation of the device in order to rapidly saturate the device during short circuit in the event of a short circuit.

8. The device of claim 7 wherein the means in the substrate generates a first threshold voltage increase of several millivolts during normal operation of the device and a second threshold voltage increase of several volts during short circuit operation of the device.

9. The device of claim 8 wherein the means in the substrate alters the conductance of channel beneath the gate in response to short circuit current through the device in order to reduce the current through the device.

10. The device of claim 5 wherein the substrate includes means for altering the body effect.

11. The device of claim 5 wherein the means for altering the body effect comprises lightly doped N-type regions self aligned with the edges of the partial gate structures.

12. The device of claim 11 wherein the lightly doped N-type regions are self aligned with the sidewall insulator of the partial gate structures.

13. The semiconductor device of claim 7 wherein the partial gate structures are either stripes or cells.

14. A semiconductor device with an integral source/emitter ballast resistor comprising:

a semiconductor substrate;

a P-well region in the substrate having a P-type polarity;

a single gate with a plurality of partial first and second gate structures spaced apart from each other on the surface of the substrate, each partial gate structure having a gate sidewall spacer insulator along the opposite edges of the gate structures and said partial gate structures extending along opposite lengths of the P-well and covering opposite portions of said P-well;

a highly doped N-type source or emitter region in the substrate and extending transverse to the gate structures;

means in the substrate, aligned with the partial gate structures, connected to the source/emitter regions, and responsive to a short circuit condition in the device for reducing the current carried by the device when the device is short circuited.

* * * * *

UNITED STATES PATENT AND TRADEMARK OFFICE
CERTIFICATE OF CORRECTION

PATENT NO. : 6,437,419 B1
DATED : August 20, 2002
INVENTOR(S) : Anup Bhalla and Praveen Muraleedharan Shenoy It is certified that error appears in the above-identified patent and that said Letters Patent is hereby corrected as shown below:

<u>Title page,</u>
Item [57], ABSTRACT,
Last line, last sentence change "o the device" to -- of the device --

Figure 9:
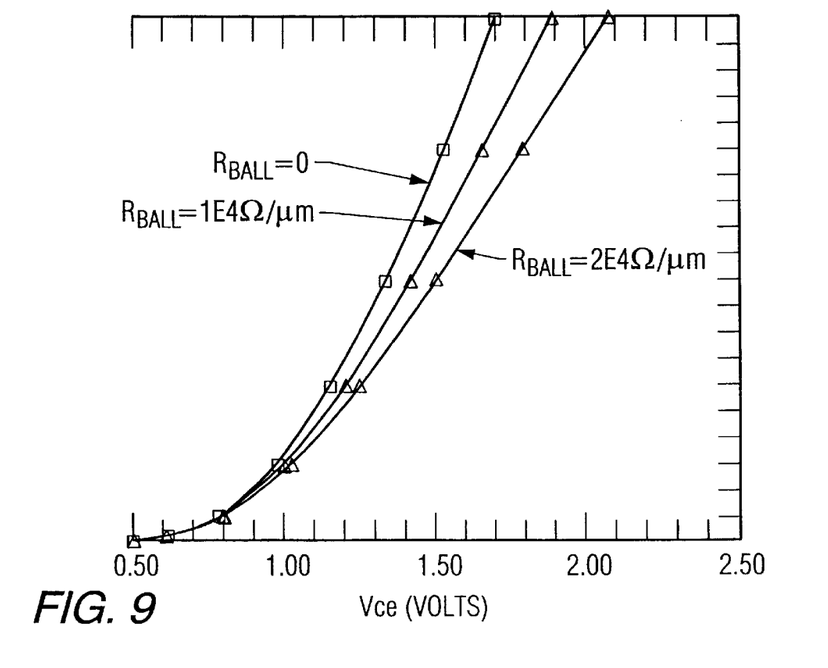
FIG. 9 shows comparative voltage drops for different emitter ballast resistances.
Figure 10:
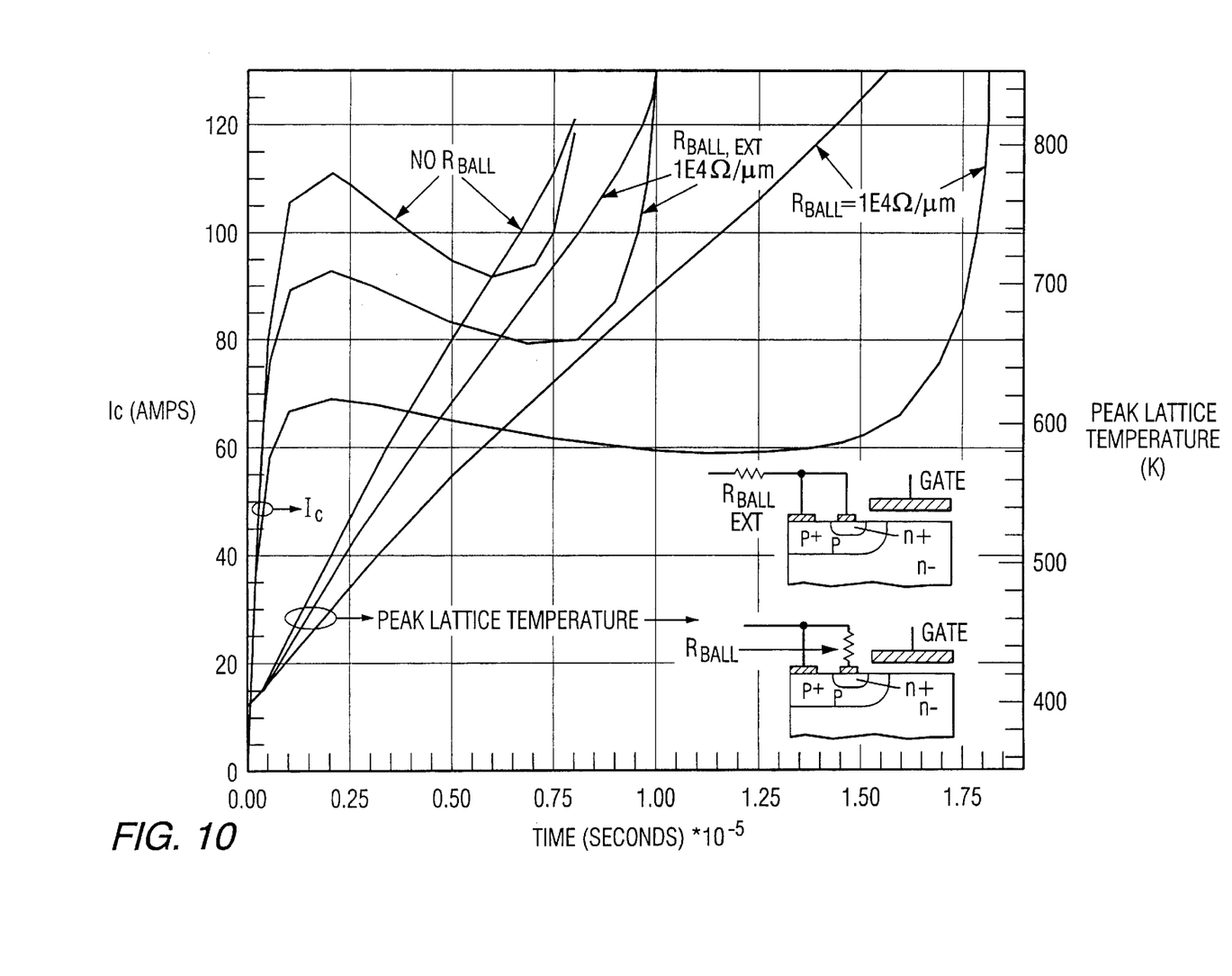
FIG. 10 shows comparative collector currents as a function of time for different emitter ballast resistances.

<u>Drawings,</u>
Figures 8 and 9:
Fig. 8: label Y axis "$J_C(A/cm^2)$" from 0 to 1.5E3
Fig. 9: label Y axis "$J_C(A/cm^2)$" from 0 to 200

<u>Column 5,</u>
Line 60, change "y = 0.8V" to -- $\gamma$ = 0.8V --
Line 66, change "y = 5.3" to -- $\gamma$ = 5.3 --

<u>Column 7,</u>
Line 16, delete "IOBTs" and insert -- IGBTs --

Signed and Sealed this

Seventeenth Day of June, 2003

JAMES E. ROGAN
*Director of the United States Patent and Trademark Office*